United States Patent [19]

Robinson

[11] Patent Number: 5,319,704

[45] Date of Patent: Jun. 7, 1994

[54] CONTROL CIRCUIT FOR VOLTAGE CONTROLLED ATTENUATOR FOR SPEAKERPHONES

[75] Inventor: Neil Robinson, Sunnyvale, Calif.

[73] Assignee: Exar Corporation, San Jose, Calif.

[21] Appl. No.: 78,716

[22] Filed: Jun. 17, 1993

[51] Int. Cl.$^5$ .................. H04M 9/10; H04M 1/19; H03F 3/45

[52] U.S. Cl. .................. 379/389; 379/388; 379/390; 379/347; 330/254

[58] Field of Search ............. 379/389, 390, 391, 347, 379/388, 395, 420; 330/254

[56] References Cited

U.S. PATENT DOCUMENTS

| | | | |
|---|---|---|---|
| 4,490,582 | 12/1984 | Munson | 379/390 |
| 4,720,856 | 1/1988 | Pace et al. | 379/390 |
| 4,724,540 | 2/1988 | Pace et al. | 379/389 |
| 4,944,002 | 7/1990 | Bader | 379/390 |

*Primary Examiner*—James L. Dwyer
*Assistant Examiner*—Scott L. Weaver
*Attorney, Agent, or Firm*—Townsend and Townsend Khourie and Crew

[57] ABSTRACT

An integrated control circuit for generating a regulated control voltage for voltage-controlled attenuators used in speakerphone circuits. The circuit provides separate transmit and receive voltage regulation to provide accurate gain settings for the voltage-controlled attenuators. The circuit eliminates the need for absolute value external components or external signal feedback between the voltage-controlled attenuators and the control circuit.

5 Claims, 8 Drawing Sheets

CONTROL CIRCUIT FOR VOLTAGE CONTROLLED ATTENUATOR FOR SPEAKERPHONES

BACKGROUND OF THE INVENTION

The present invention relates to voltage controlled attenuator circuits, and a means to provide accurate gain settings for such attenuators. In particular, the invention relates to such circuits for use in integrated circuit speakerphone systems.

Voltage controlled attenuators find applications in a wide variety of systems, to adjust the amplitude of signals passed through such systems according to the magnitude of a control signal. For example, in a speakerphone circuit, attenuators are included in both the transmit and receive channels to provide half duplex communication. The transmit and receive attenuators are typically operated in a complementary manner, while one is at maximum gain the other is at maximum attenuation and vice versa. The setting of each attenuator is adjusted so that the difference between the levels remains the same. Using this technique a constant loss is inserted between the two channels and prevents instability that would otherwise occur, due to signal coupling between the loudspeaker and microphone, or sidetone through a hybrid circuit. One requirement of attenuators used in a such an arrangement is accurate gain settings to ensure consistent performance of the speakerphone system. Large variations of the gain level of each attenuator makes the inserted loss between the two channels unpredictable and presents difficulties maintaining the stability of the system.

In a typical speakerphone, the gain setting of a channel is dependent upon the detection of speech within that channel. If a far end talker is speaking, the receive signal is greater than the transmit signal, and the transmit attenuator should be set to maximum loss while the receive attenuator is set to maximum gain. The reverse is true if the mirror-end talker is speaking. By monitoring the amplitudes of the signals in both channels, a control circuit may be developed to determine which channel is active and adjust the gains accordingly. A further requirement of an attenuator used in a speakerphone is the need to minimize the feedthrough of control signal into the audio path. Feedthrough generates an audible "thump" in the speech channel which occurs when switching from one channel to the other. With sufficient magnitude, the feedthrough causes errors in switching due to its detection as a false speech signal. The primary source of feedthrough is gain dependent offset within the attenuator.

Figure 2:
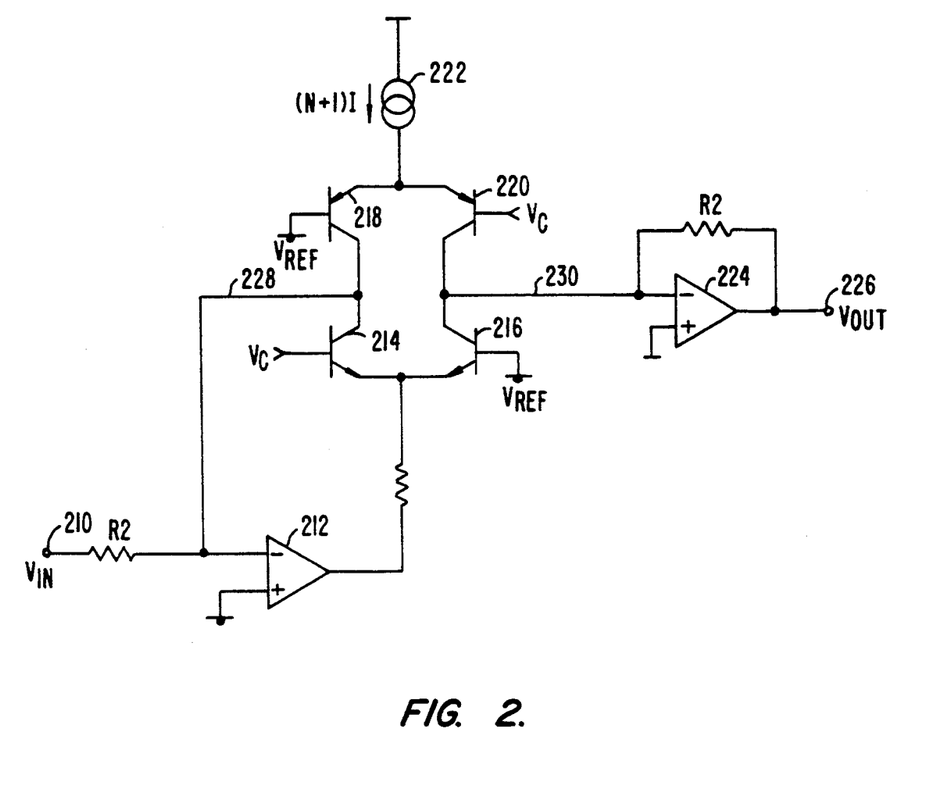
FIG. 2 is a diagram of a prior art voltage controlled attenuator.

FIG. 2 illustrates an example of a prior art voltage controlled attenuator. An input voltage is provided at a point 210 through a resistor R2 to a first amplifier 212. Amplifier 212 operates to sink the current from emitter coupled transistors 218, 220 and 214, 216 which receive current from a current source 222. The output is provided through a second amplifier 224 to a voltage output 226. A control voltage indicated VC is applied to transistor 214 and transistor 220. The control voltage VC affects the two transistors in opposite ways, one being NPN, the other PNP. In response to an increasing control voltage, the current in transistor 214 will increase while the current in transistor 220 will decrease. Thus, the current through the two legs of the amplifier section will split in proportion with the control voltage. In accordance with this varying current, the voltage amplification between the input at point 210 and the output at point 226 will vary, such that the gain of the attenuator is directly proportional to the split of the current from current source 222.

One problem with a circuit such as that shown in FIG. 2, when used in a typical bipolar integrated circuit, is the different characteristics of the NPN and PNP transistors, which causes a DC feedthrough from the input to the output and which varies in accordance with the level of amplification set by the control voltage. It would be desirable to have a voltage controlled attenuator which eliminates this DC feedthrough effect due to the use of both NPN and PNP transistors in the current splitting core.

SUMMARY OF THE INVENTION

The present invention provides a voltage controlled attenuator and gain control mechanism which reduces DC feedthrough by using NPN transistors exclusively to perform current splitting in the voltage controlled attenuator core. Also, a gain control voltage generator is disclosed which makes use of the accuracy of component matching in integrated circuit technology, independently of process variations, to generate a precise control voltage without the need for external components, on chip trimming, or complex feedback mechanisms. In the voltage controlled attenuator, a pair of emitter coupled NPN transistors are provided, connected to a common current source. The current flow in each of the NPN transistors is mirrored by a matched PNP current mirror, to a second set of matched NPN transistors which are also emitter coupled. A common control voltage, which is preferably differential, is connected to the emitter coupled NPN pairs. A feedback control loop adjusts the current in the second set of emitter coupled NPN transistors such that the sum of currents from the second NPN pair is equal to that of the first pair. Signal input and output are connected to the collectors of the second NPN pair. The arrangement of the voltage controlled attenuator defines the current flow through the PNP devices with NPN devices, thereby providing independence of the PNP characteristics in the current splitting core.

In the gain control voltage generator, two pairs of emitter coupled NPN transistors are provided, each connected to a common current source, providing a current in each pair proportional to the current in the voltage controlled attenuator core. Resistors, with a value ratio of NR:R and R:NR, are connected in the collector circuits of each NPN pair. Feedback from each resistor pair to a common rate control capacitor and differential amplifier is provided such that the voltage difference appearing across either set of resistors may be set to zero in response to the detection of receive or transmit signals in the speakerphone. A resulting gain control voltage is generated at the input of the active NPN pair, which, when connected to the control inputs of the attenuator core, produces a voltage gain inversely proportional to the ratio of the resistors in the active pair of the control voltage generator. This arrangement provides a control voltage which is accomplished without a DC feedback loop from the attenuators, such as set forth in U.S. Pat. No. 4,720,856.

For a fuller understanding of the nature and advantages of the invention, reference should be made to the ensuing detailed description, taken in conjunction with the accompanying drawings.

DESCRIPTION OF SPECIFIC EMBODIMENTS

Figure 1:
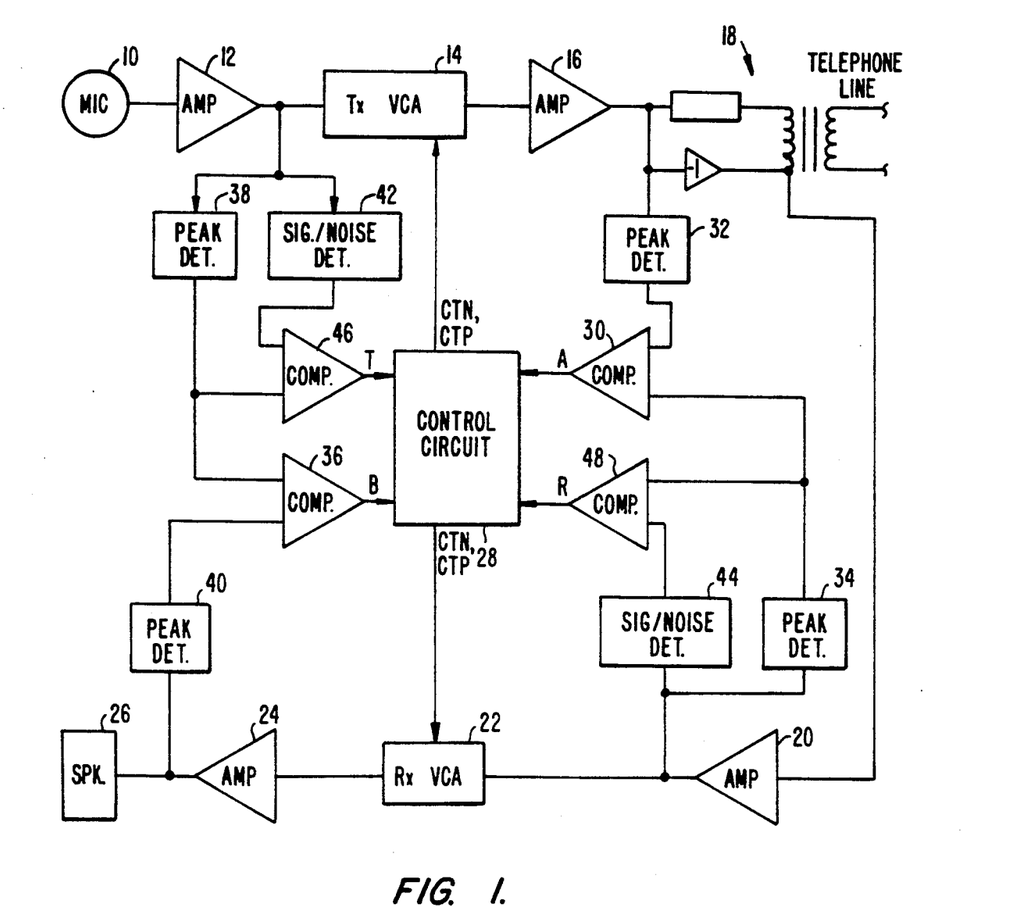
FIG. 1 is a block diagram of a four-point sensing circuit for a speakerphone using voltage controlled attenuators.

FIG. 1 is a block diagram of a speakerphone circuit according to the present invention. A microphone 10 provides a signal through a microphone amplifier 12, a voltage controlled attenuator 14, a second amplifier 16 and a transmission circuit 18 coupled to the phone line. A receive channel provides a signal from transmission circuit 18 through a filtering amplifier 20, a voltage controlled attenuator 22 and a speaker amplifier 24 to a speaker 26. A control circuit 28 controls the gain of the transmit attenuator 14 and the receive attenuator 22.

The gain of the transmit and receive attenuators are set in a complementary manner, so that only one channel has its gain set to a high value at any one time, during the transmit or receive mode. The sum of the gains of the two channels remains constant. In the idle mode, when neither party is talking, the gains in the channels are equalized.

The control circuit operates on four primary inputs, although other secondary signals may be input to the system to refine operation. A first input is indicated as A. This signal is output from comparator 30 which receives its inputs through peak detectors 32 and 34 respectively, acting on the signal from amplifier 16 in the transmit channel and amplifier 20 in the receive channel. Similarly a comparator 36 provides signal B from a comparison of the signals provided through peak detectors 38 and 40 coupled to the output of microphone amplifier 12 and speaker amplifier 24, respectively. The other inputs, which indicate the presence of speech in a channel are from background noise detector circuits 42 and 44. These circuits, which indicate the noise level in each channel, are compared to the signal from peak detectors 38 and 34, respectively, in comparators 46 and 48 respectively, to provide signals T and R to the control circuit. The signal T indicates the presence of voice signal greater than noise, by a predetermined threshold, in the transmit channel, while the signal R indicates the presence of voice greater than noise, by a second threshold, in the receive channel.

Figure 3:
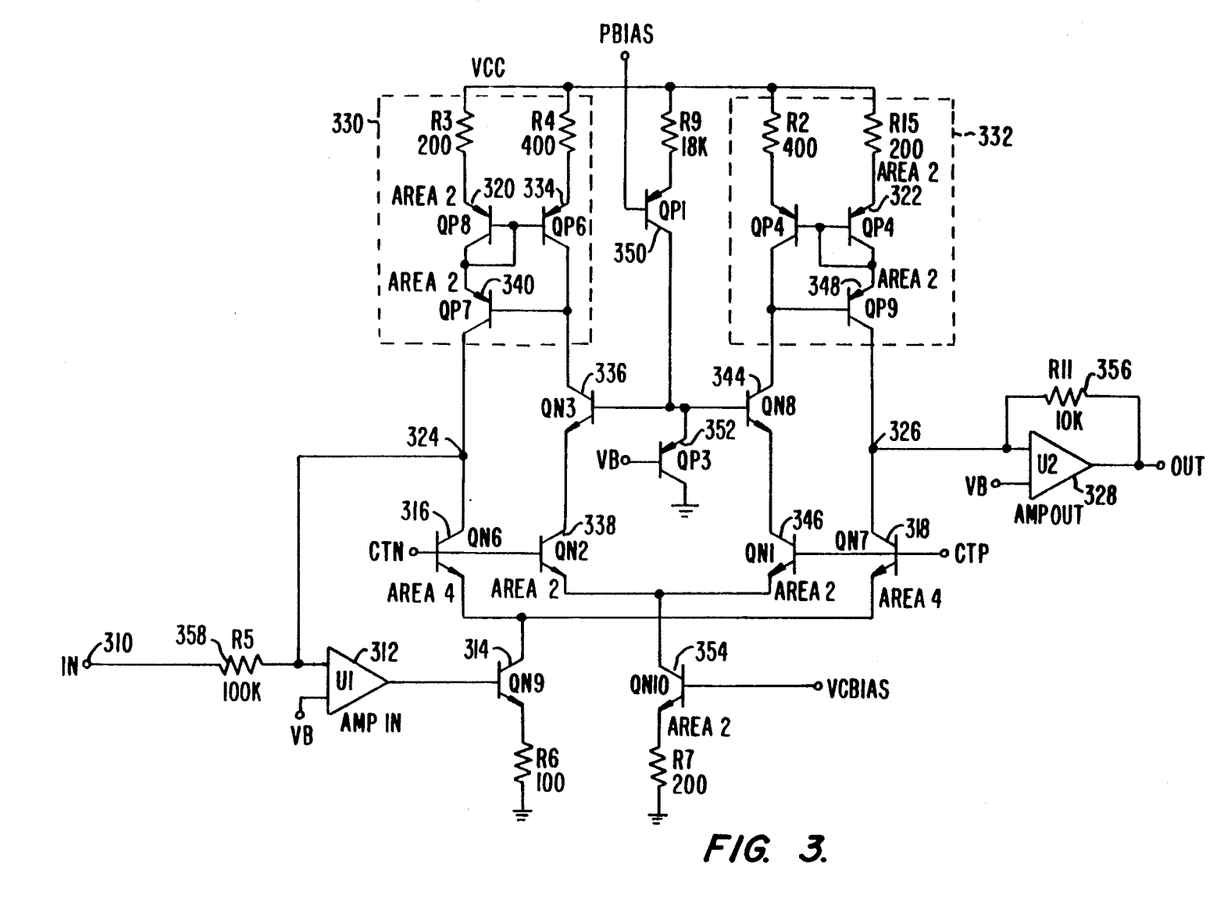
FIG. 3 is a circuit diagram of a preferred embodiment of a voltage controlled attenuator according to the present invention.

FIG. 3 is a diagram of a preferred embodiment of voltage controlled attenuator, 14 or 22 of FIG. 1. An input signal is provided on node 310 through a resistor 358 to an input amplifier 312. Amplifier 312 is connected to transistor 314, which has its collector tied to the emitters of transistors 316 and 318. The collectors of transistors 316 and 318 are coupled to the collectors of PNP transistors 340 and 348 respectively. An input node to this transistor arrangement is at point 324, and the output node is at point 326, where it is provided through an output amplifier 328.

PNP transistors 340 and 348 form parts of current mirror arrangements 330 and 332 respectively. The reference current for mirror 330, flowing in PNP transistor 334 is from NPN transistors 336 and 338. The mirror output current, flowing in PNP transistor 320 and 340 is to NPN transistor 316, and forms one part of the total current flowing in NPN transistor 314. Similarly, the reference current for current mirror 332, flowing in PNP transistor 342 is from NPN transistors 344 and 346. The mirror output current, flowing in PNP transistor 322 and 348 is to NPN transistor 318, and forms the second part of the total current flowing in NPN transistor 314. Transistors 336 and 344 are in a cascode arrangement to reduce DC feedthrough to the output of amplifier 328 by minimizing the voltage difference between the collectors of NPN transistors 338 and 346 and NPN transistors 316 and 318. The reference voltage VB to amplifiers 312 and 328 defines the DC level of the collectors of transistors 316 and 318 respectively by feedback action around amplifiers 312 and 328. PNP transistor 352 base voltage is also set at VB and thus its emitter at one vbe above VB. Transistors 336 and 344 drop one vbe from their base to emitter terminals to set the collectors of transistors 338 and 346 at the reference voltage level VB. PNP transistor 350 provides the bias current for this arrangement.

A differential control voltage CTN, CTP, is applied between the bases of transistors 318 and 346 on the positive side, and transistors 316 and 338 on the negative side. In operation the control signal acts to split the DC reference current provided by transistor 354 between transistors 338 and 346 in a ratio defined by the magnitude of the control signal, such that:

$$\frac{i2}{i1} = \exp\left(\frac{\Delta v con}{vt}\right)$$

where: i1 is the current flow in 338
i2 is the current flow in 346
Δvcon is the differential control voltage
vt is the thermal voltage kt/q The same ratio of DC current division occurs in transistors 316 and 318, their base voltage being common with transistors 338, 346 respectively. The level of current in transistor 314 is adjusted by feedback action through amplifier 312 to exactly match the sum of the currents through transistors 316 and 318, which is set by mirrors 330 and 332, thereby minimizing any offset voltage at the output of amplifier 328. AC current flow in transistor 314, injected by amplifier 312 from the input signal at 310, is split in a ratio which approaches the DC current division between transistors 316 and 318. The AC component of current in 318 flows to the output through resistor 356, providing signal gain or attenuation dependent on the current split defined by the applied control voltage.

$$Av = \frac{Rout}{Rin} \cdot \frac{i2}{i1}$$

where: Av is the AC voltage gain of the system.
Rout is feedback resistor 356 of amplifier 328
Rin is input resistor 358 of amplifier 312

The other input signals, PBIAS and VCBIAS to FIG. 3 are bias voltages necessary for correct circuit operation.

Figure 4:
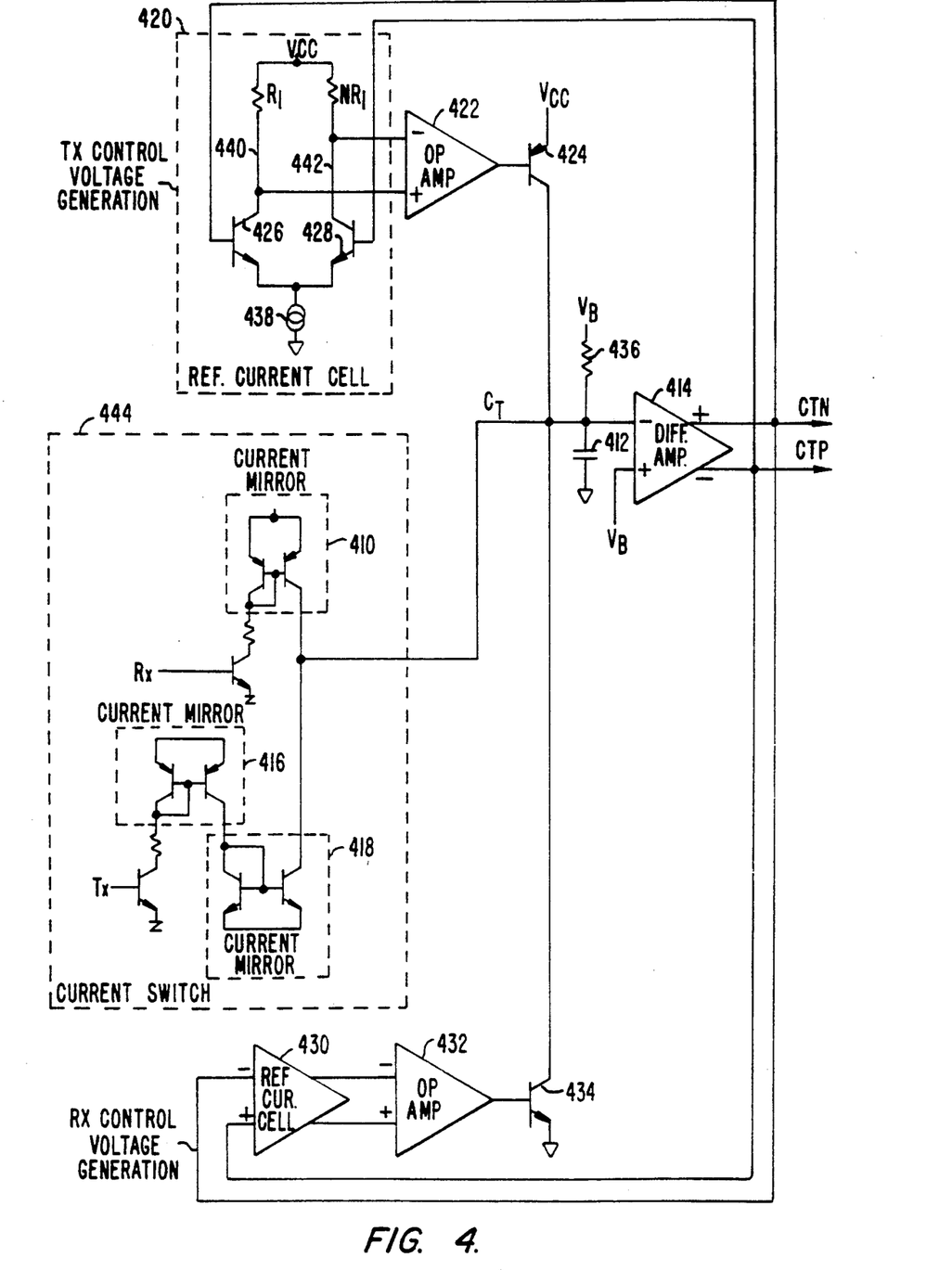
FIG. 4 is a block diagram of a control circuit which generates the control signals for the VCA of FIG. 3.

FIG. 4 is a block diagram of a control circuit for providing the differential control voltage CTN, CTP, to the VCA of FIG. 3. The sense and magnitude of signals CTN, CTP are determined by the state of the receive and transmit detect signals RX and TX. These inputs, provided by a decision circuit, indicate the presence of receive or transmit speech in the speakerphone. A capacitor 412, connected to control node CT is alternately charged or discharged by current mirrors 410 or 418, in response to signals RX or TX respectively. With neither RX or TX active, capacitor 412 is returned to a center voltage, VB, by resistor 436. Differential amplifier 414 buffers the voltage at CT to produce output signals CTN and CTP. Feedback is provided through a reference current cell 420, operational amplifier 422, and transistor 424 to regulate the negative voltage generated at CT in response to the TX input. A second feedback path is provided through reference current cell 430, (details of current cell 430 are the same as shown for current cell 420) operational amplifier 432 and transistor 434 to regulate the positive voltage generated at CT in response to the RX input. The feedback circuits regulate the voltage at CT to a predetermined level, defined by the ratio of resistors 440 and 442 for negative voltages, equivalent resistors for positive voltages, and the gain of differential amplifier 414. To more clearly understand the operation of the regulation mechanism, consider the operation of the transmit feedback path: upon detection of valid transmit signals by the decision circuit, input signal TX is set active, and RX inactive. Current is applied to the reference leg of current mirror 416, producing an output current from current mirror 418, and discharging capacitor 412, thereby reducing the voltage at point CT. Differential amplifier 414 tracks the voltage at CT, such that voltage CTP reduces whilst CTN increases. These signals connect to the base terminals of transistors 428 and 426 respectively, reducing the current through 428, while increasing the current through 426. The differential voltage generated across resistors 440 and 442 is applied at the input of operational amplifier 422. Due to the high gain of amplifier 422, the output voltage remains held at its maximum positive value, holding PNP transistor 424 off, and allowing capacitor 412 to discharge, until the positive input voltage of amplifier 422 falls below its negative input voltage. At this point the output voltage of amplifier 422 falls and transistor 242 is turned on preventing further discharge of capacitor 412, and fixing the voltage at CT, such that:

$$vct = CAdm*vt*in(N1)$$

where:
vct is the voltage at CT with respect to VB
Adm is the gain of differential amplifier 414
vt is the thermal voltage kt/q
N1 is the ratio of resistor 440, 442 of FIG. 4

Figure 7:
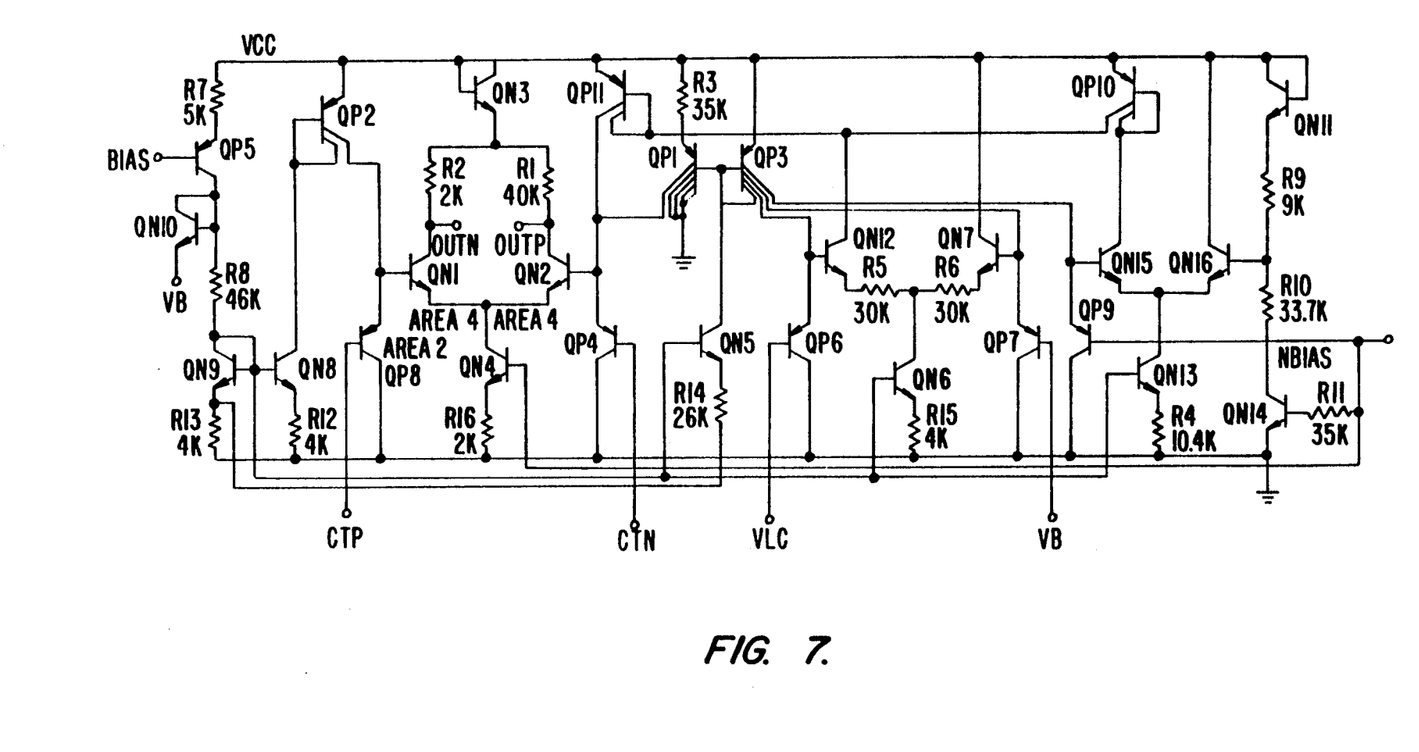
FIG. 7 is a detailed circuit diagram of the receive current setting circuit of FIG. 4.

Operation of the receive regulation mechanism is the inverse of the transmit mechanism. Upon detection of valid receive signals by the decision circuit, input signal RX is set active, and TX inactive. Current is applied to the reference leg of current mirror 410, producing an output current from current mirror 410, and charging capacitor 412, thereby increasing the voltage at point CT. Elements 430, 432 and 434 form a second feedback path to set the magnitude of the positive voltage developed at CT such that:

$$vct = Adm*vt*1n(N2)$$

where:
vcr is the voltage at CT with respect to VB
Adm is the gain of differential amplifier 414
vt is the thermal voltage kt/q
N2 is the ratio of resistor R1, R2 of FIG. 7

Figure 5:
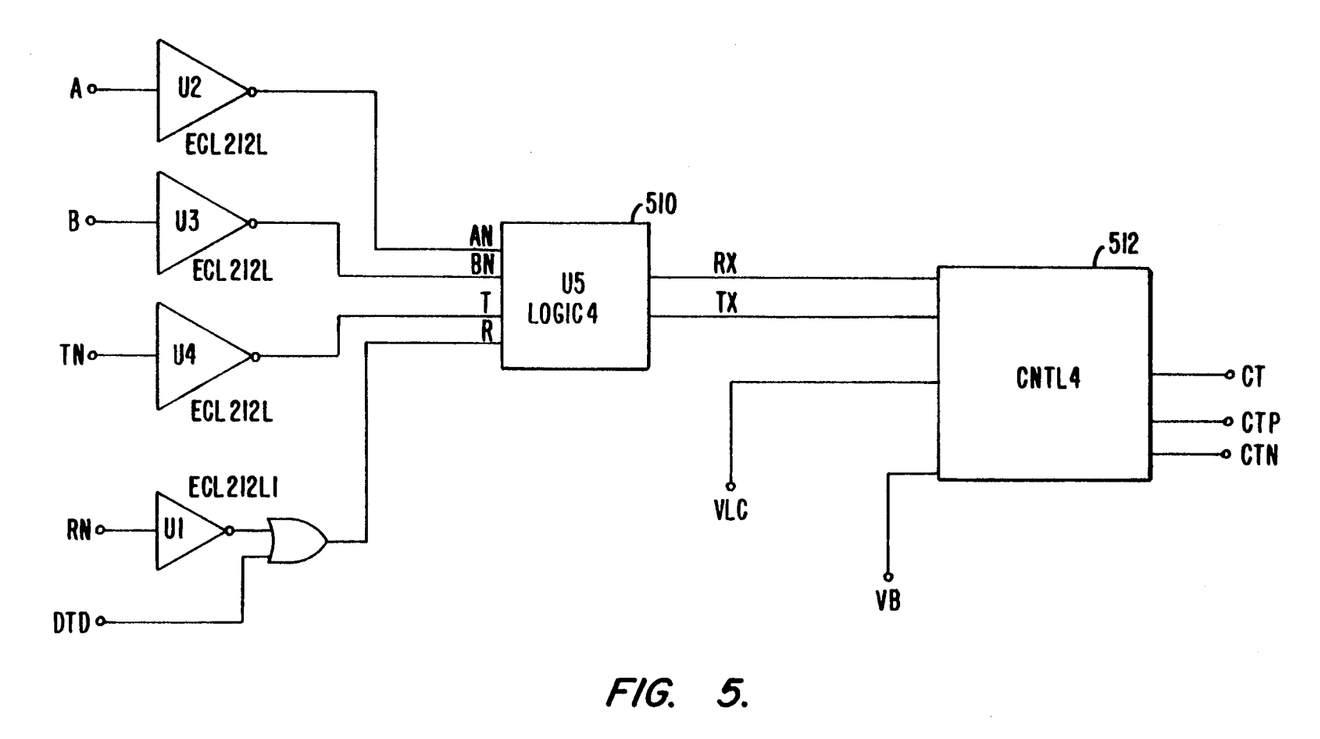
FIG. 5 is a block diagram of the logic circuit for generating the receive and transmit detect signals provided to the circuit of FIG. 4.

The generation of the RX and TX signals can be seen from the diagram of FIG. 5, which shows A and B inputs, and TN and RN inputs (reflecting $\overline{T}$ and $\overline{R}$), which are provided by elements of the circuit given in FIG. 1. These form input signals to logic block 510, which generates the RX and TX signals input to control circuit 512, which is the control circuit of FIG. 4.

Figure 6:
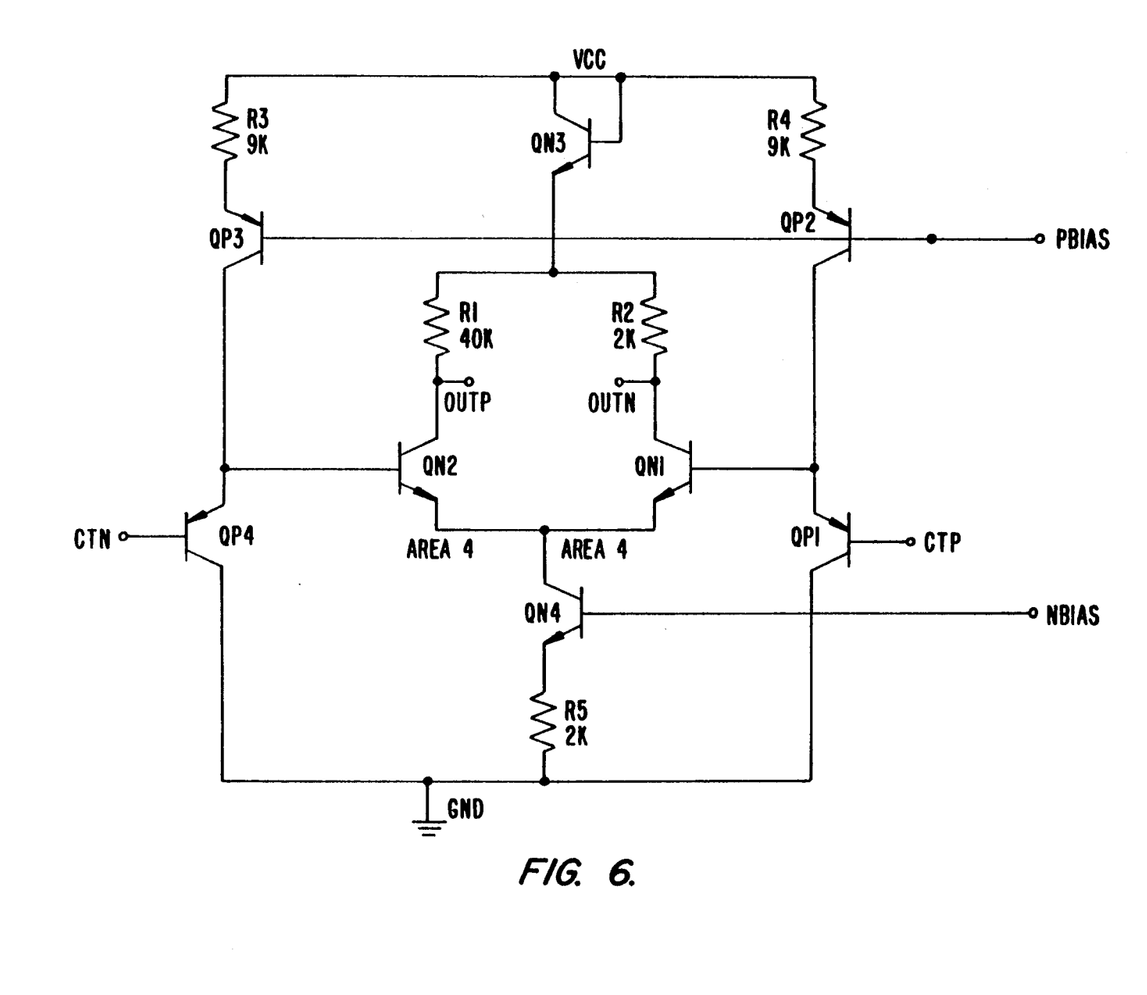
FIG. 6 is a circuit diagram of the transmit current setting circuit of FIG. 4.
Figure 8:
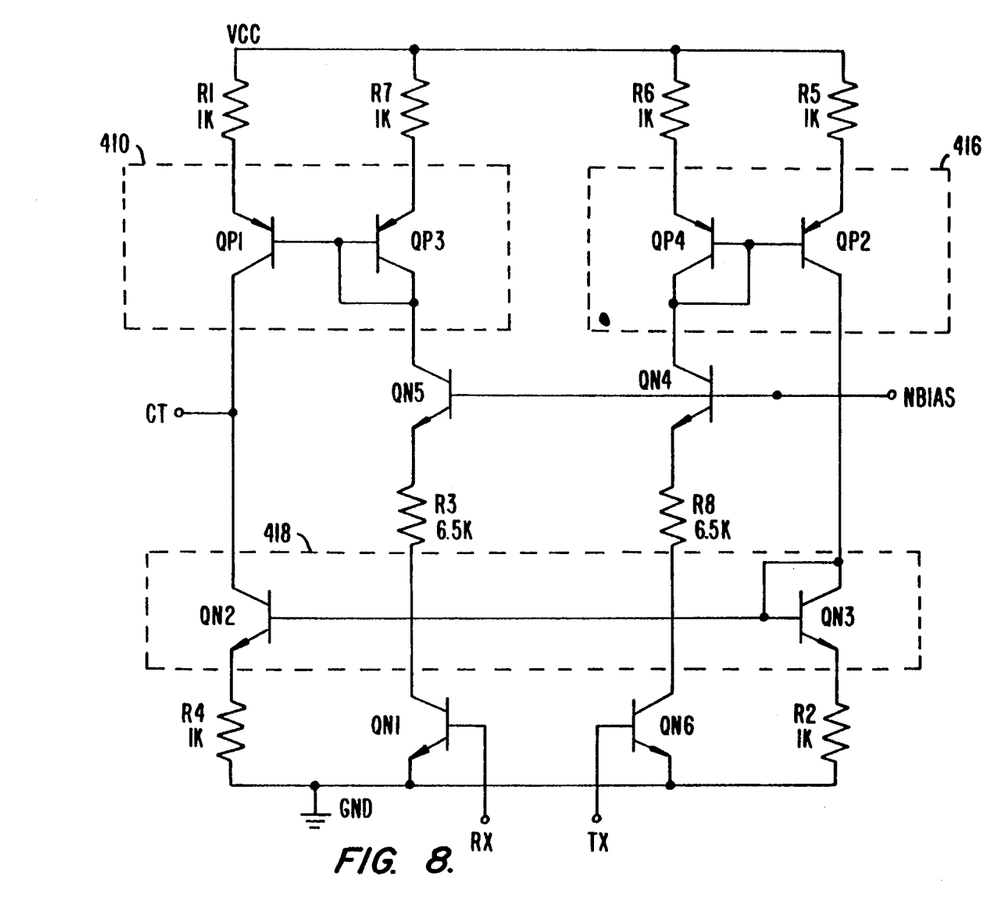
FIG. 8 is a circuit diagram of the current switching circuit of FIG. 4.

The current switching circuit 444, connected to node CT in FIG. 4 is given in more detail in FIG. 8. The input signal NBIAS is a bias voltage necessary for correct circuit operation. FIG. 6 shows a circuit level diagrams of the transmit reference current cell, 420. As may be determined from FIG. 6, the ratio of resistors 440 and 442 is 2K:40K, or an N of 20. A similar ratio is used in the receive current cell.

As will be understood by those familiar with the art, the present invention may be embodied in other specific forms without departing from the spirit or essential characteristics thereof. Accordingly the disclosure of the preferred embodiment of the invention is intended to be illustrative, but not limiting, of the scope of the invention which is set forth in the following claims.

What is claimed is:

1. A control circuit for generating a differential gain control signal for receive and transmit voltage controlled attenuators in response to receive and transmit detect signals in a speakerphone circuit, comprising:
    means for sourcing current in response to said receive detect signal, having an output coupled to a control node;
    means for sinking current in response to said transmit detect signal, having an output coupled to a control node;
    a capacitor coupled to said control node;
    a differential amplifier having a first input coupled to said control node, a second input connected to a reference voltage, and outputs providing said differential gain control signal;
    receive voltage regulator means having inputs coupled to said differential amplifier outputs and an output coupled to said control node, for regulating a ratio of currents supplied to the receive voltage controlled attenuator; and
    transmit voltage regulator means having inputs coupled to said differential amplifier outputs and an output coupled to said control node, for regulating a ratio of currents supplied to the transmit voltage controlled attenuator.

2. The control circuit of claim 1 further comprising a resistor having a first terminal coupled to said control node and a second terminal coupled to said reference voltage.

3. The control circuit of claim 1 wherein said receive voltage regulator means comprises:

first and second emitter coupled transistors each having a base coupled to one of said differential amplifier outputs, a resistor of value R coupled to a collector of said first emitter coupled transistor, a resistor of value NR coupled to a collector of said second emitter coupled transistor;

a first operational amplifier having first and second inputs coupled to said collectors of said first and second emitter coupled transistors, respectively; and a third transistor having a base coupled to an output of said first operational amplifier and a collector coupled to said control node.

4. The control circuit of claim 3 wherein said transmit voltage regulator means comprises:

fourth and fifth emitter coupled transistors each having a base coupled to one of said differential amplifier outputs, a resistor of value R coupled to a collector of said fourth emitter coupled transistor, a resistor of value NR coupled to a collector of said fifth emitter coupled transistor;

a second operational amplifier having first and second inputs coupled to said collectors of said fourth and fifth emitter coupled transistors, respectivley; and a sixth transistor having a base coupled to an output of said second operational amplifier and a collector coupled to said control node.

5. The control circuit of claim 4 wherein said first and second and said fourth and fifth emitter coupled transistors and said third transistor are NPN bipolar transistors and said sixth transistor is a PNP bipolar transistor.

* * * * *